(12) United States Patent
Udagawa et al.

(10) Patent No.: US 6,291,262 B1
(45) Date of Patent: Sep. 18, 2001

(54) SURFACE MOUNT TO-220 PACKAGE AND PROCESS FOR THE MANUFACTURE THEREOF

(75) Inventors: Hisao Udagawa, Hadano; Hiroshi Kotani, Kanagawa, both of (JP)

(73) Assignee: International Rectifier Corp., El Segundo, CA (US)

( * ) Notice: Subject to any disclaimer, the term of this patent is extended or adjusted under 35 U.S.C. 154(b) by 0 days.

(21) Appl. No.: 09/563,358

(22) Filed: May 3, 2000

Related U.S. Application Data

(62) Division of application No. 08/940,230, filed on Sep. 30, 1997, now Pat. No. 6,114,750.
(60) Provisional application No. 60/027,333, filed on Oct. 1, 1996, and provisional application No. 60/029,670, filed on Oct. 30, 1996.

(51) Int. Cl.[7] ........................................................ H05K 3/34
(52) U.S. Cl. ............................ 438/106; 438/112; 438/124
(58) Field of Search ........................................ 438/106, 123, 438/112, 124, 127

(56) References Cited

U.S. PATENT DOCUMENTS

| | | | |
|---|---|---|---|
| 4,987,473 | * | 1/1991 | Johnson . |
| 5,083,368 | * | 1/1992 | Frank ........................................ 29/840 |
| 5,191,403 | * | 3/1993 | Nakazawa .............................. 257/787 |
| 5,291,059 | * | 3/1994 | Ishitsuka et al. . |
| 6,178,628 | * | 1/2001 | Clemens ................................. 29/840 |

* cited by examiner

*Primary Examiner*—Roy Potter
(74) *Attorney, Agent, or Firm*—Ostrolenk, Faber, Gerb & Soffen, LLP

(57) ABSTRACT

A surface mount TO-220 package includes leads which are bent within the molded housing and formed prior to molding the housing around the lead frame. A single gauge of frame material is used for both the leads and the main pad area. The bends reduce the height of the package and reduce mechanical stresses in the molded housing.

7 Claims, 4 Drawing Sheets

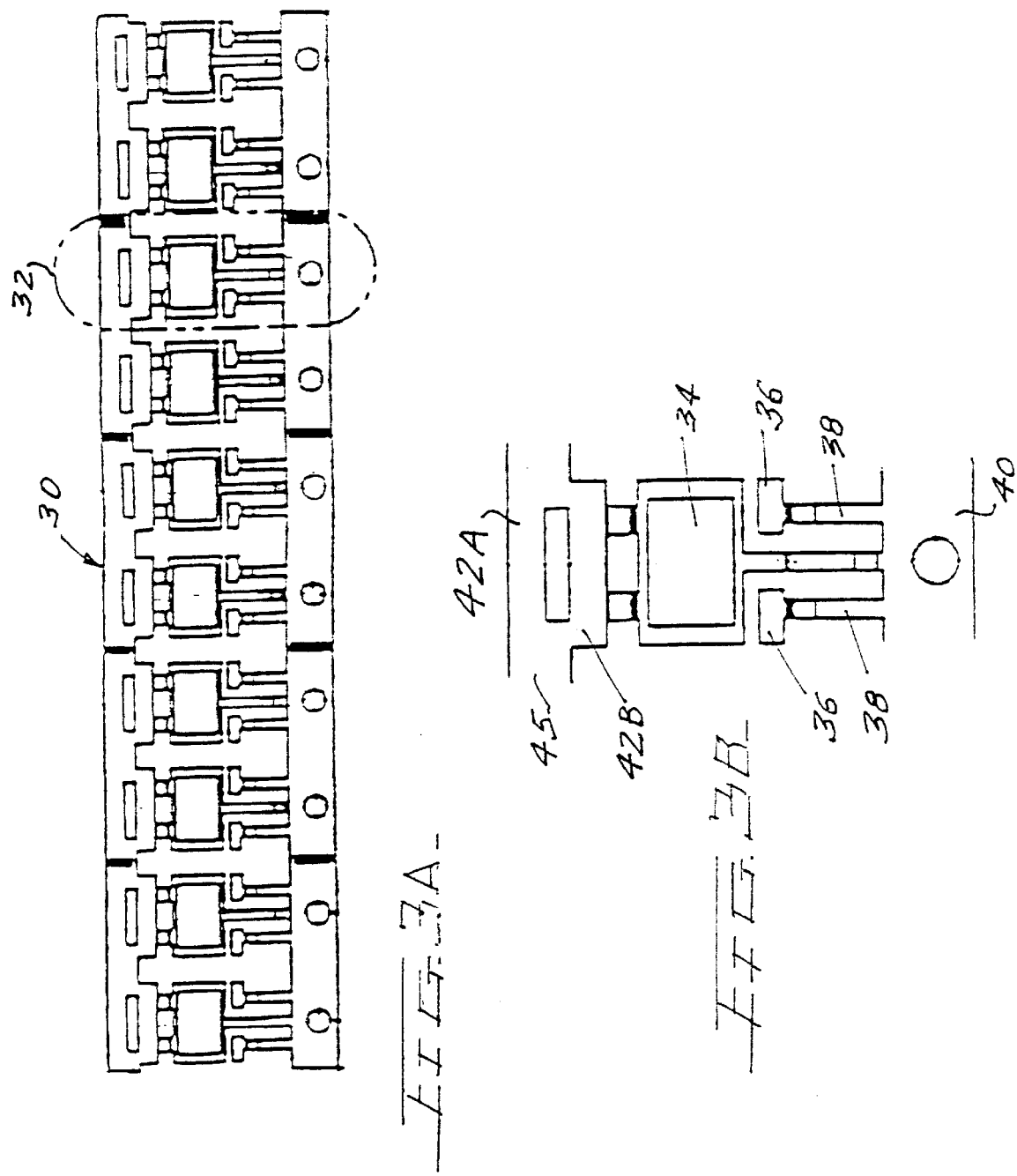

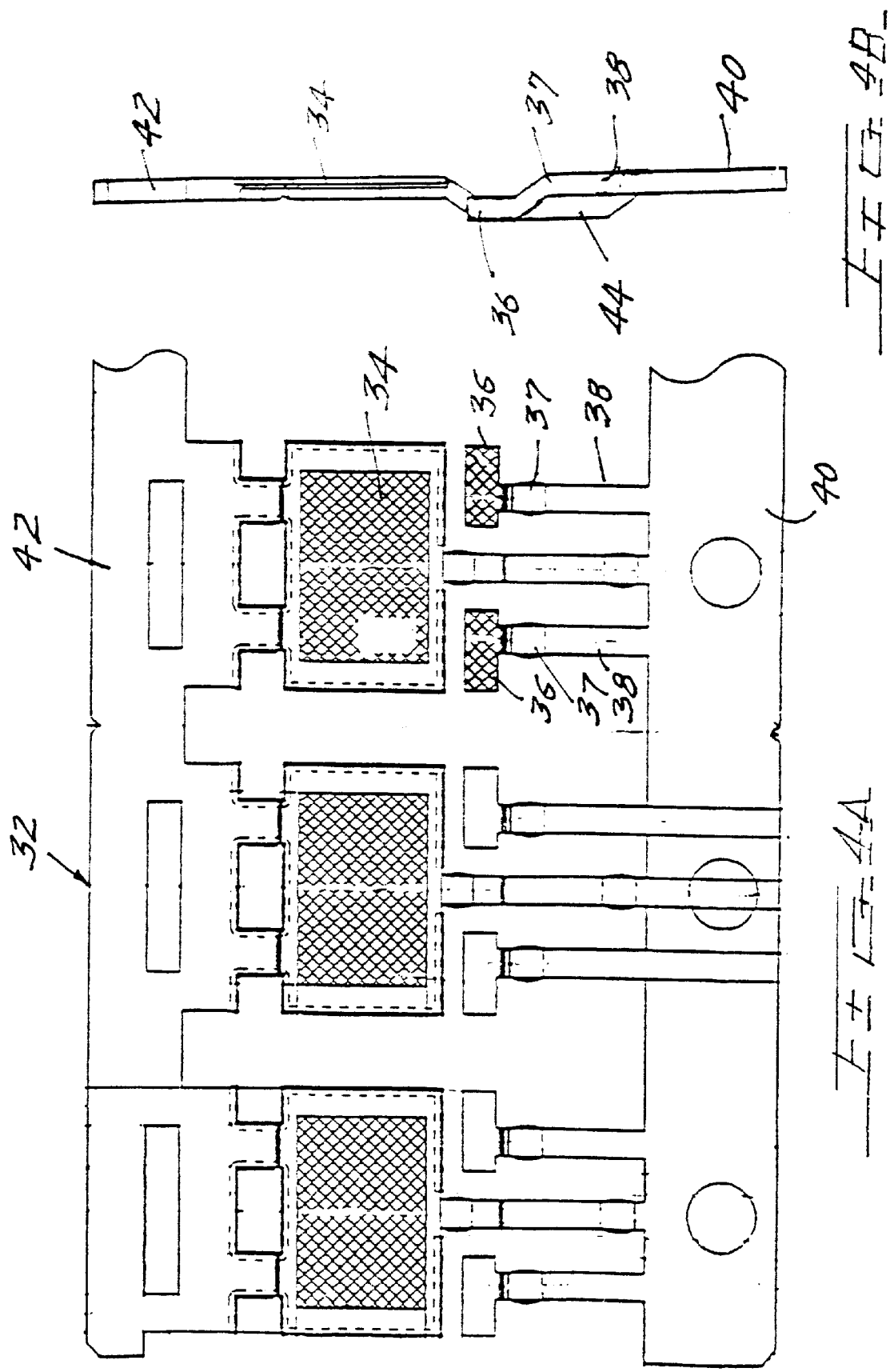

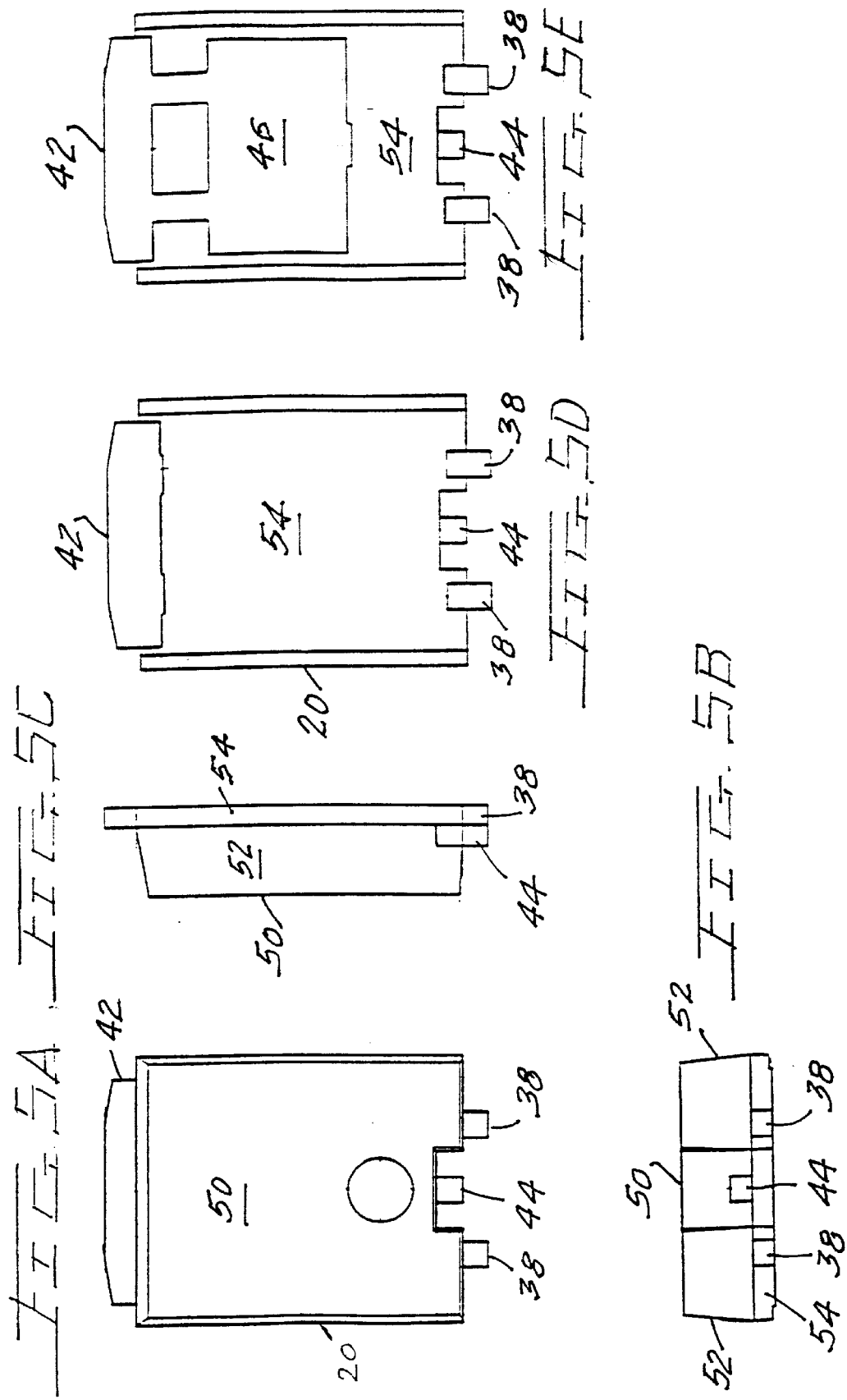

SURFACE MOUNT TO-220 PACKAGE AND PROCESS FOR THE MANUFACTURE THEREOF

This is a division of application Ser. No. 08/940,230, filed Sep. 30, 1997. Now U.S. Pat. No. 6,114,750 and also claims the benefit of Provisional No. 60/027,333 filed Oct. 1, 1996 and No. 60/029,670 filed Oct. 30, 1996.

FIELD OF INVENTION

The present invention relates to a package for semiconductor devices and, more specifically, to a novel surface mount TO-220 device package.

BACKGROUND OF THE INVENTION

The TO-220 package is a known industry standard. The package includes a thermally conductive base which is preferably metal and on which a semiconductor device is mounted with low thermal impedance between the device and the base. The device may also be electrically connected to the base. The semiconductor device and a portion of the frame are typically encapsulated by a resin material, which protects the device from its environment. A locking projection typically extends from the base to the outside of the protective epoxy and is fastened to the external mounting surface to draw heat from the device. Also included are lead terminals which extend outside the resin body and include bonding pads to which a wire bond connection is provided from the device to the leads.

In a surface mount device, the surface of the base that is adjacent to the circuit board and opposite from the device is exposed for electrical contact to the circuit board.

Typically, the leads are bent outside the resin body to contact the surface and provide electrical connection to the circuit board. This bend in the leads, however, can cause mechanical stresses in the resin body.

Moreover, two gauges of metal are typically used. A thick gauge metal is used for the base, and a thin gauge metal is used for the leads so that they may be bent. This use of two gauges increases the complexity of the manufacture of the package device.

SUMMARY OF THE INVENTION

The present invention provides for a surface mount TO-220 package in which the leads are bent prior to molding the resin body around the device and frame to minimize the mechanical stress on the leads. Also, a single gauge of lead frame material is used for both the leads and the main pad area, which minimizes material costs and reduces the height of the package body. The length of the leads outside of the package is also shortened. Though the combined length of the leads inside and outside the package is increased, the built-in resistance and inductance of the package is substantially reduced because the thickness of the leads is the same as that of the main pad area. The lead frame configuration also improves assembly yield. The package is suitable to be a drop-in replacement for existing surface mount design TO-220 type packages but can accept larger die sizes than existing size 4 die.

BRIEF DESCRIPTION OF THE DRAWINGS

The invention will now be described in greater detail in the following detailed description with reference to the drawings in which:

FIG. 3A is a top view of a strip of lead frames and their supports which are used in the manufacture of the present invention;

FIG. 3B is an enlarged view of one of the lead frames and its supports;

FIG. 4A is an enlarged view showing several of the lead frames and supports shown in FIG. 3A in greater detail;

FIG. 4B is a side view of the strip shown in FIG. 4A; and

FIGS. 5A–5E are top, end, side and bottom views, respectively, of a package body according to the present invention.

DETAILED DESCRIPTION OF THE INVENTION

Figure 1:
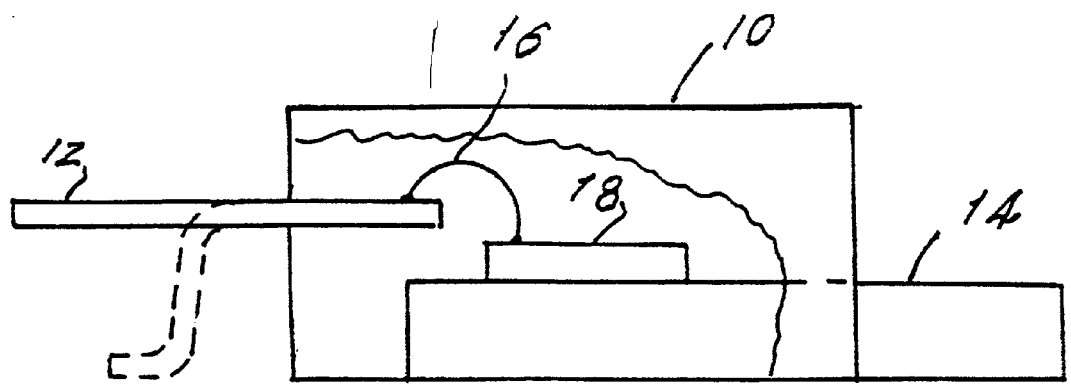
FIG. 1 shows a partial cutaway side view of a known surface mounted TO-220 package.

Referring first to FIG. 1, there is shown a conventional surface mounted TO-220 device package 10, illustrated in a cutaway side view. A surface of semiconductor device 18 is attached to a metal plate 14. The plate 14 provides thermal contact with the device 18 but may also be electrically connected to the device. An opposing surface of the device 18 is connected to one or more lead terminals 12 by wire bonds 16. The device 18 and a portion of lead terminal 12 and plate 14 are encapsulated in a package body, typically of resin.

To provide for contact with the mounting surface, the lead terminals 12 are bent downward, as shown by the dashed lines extending from lead terminal 12, after the package body is molded around the frame. The process of bending after molding causes mechanical stresses in the package body.

The plate 14 also has a greater thickness than the lead terminal 12 so that the frame must be fabricated of two gauges of metal.

Figure 2:
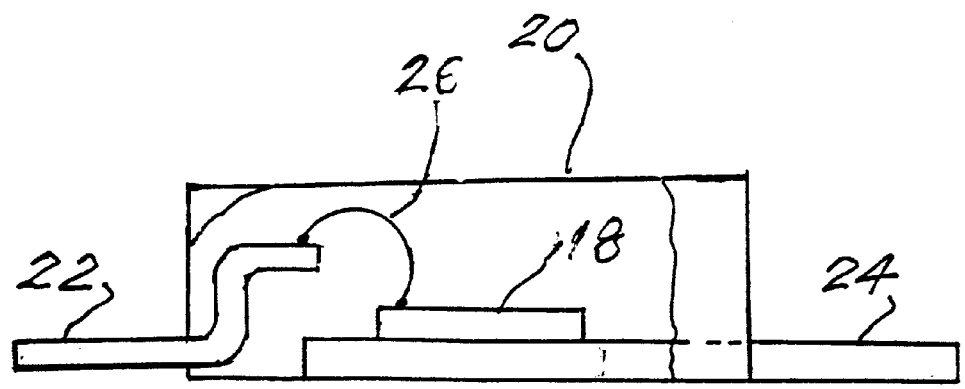
FIG. 2 shows a partial cutaway side view of a surface mounted package according to an embodiment of the present invention.

FIG. 2 illustrates a surface mounted TO-220 device package 20 according to an embodiment of the invention. Here, lead terminal 22 is bent prior to molding the package body around the frame and is located inside the package body to minimize mechanical stresses on the package body. Moreover, the lead terminal 22 is of the same thickness as plate 24 so that the package may be formed of frame material of a single gauge which reduces the built-in resistances and inductances in the package. The height of the package 20 is significantly reduced when compared to the known package 10. Furthermore, though a longer length of the lead terminal 22 may be used, the length of the portion of lead terminal 22 that extends outside the package 20 is reduced.

FIG. 3A shows a strip 30 of multiple device frames 32 with their connecting supports, one of which is shown in greater detail in FIG. 3B. The frame includes a main pad area 34 to which a device is electrically and thermally attached. The main pad area 34 is connected to a plate 42 which has a lower portion 42A which forms a surface contact with pad area 34 to the mounting surface and has an upper portion 42B which provides support for the frame and is subsequently removed after molding. The plate 42 is connected to an adjoining frame by support 45.

Also provided are bonding pads 36 which are connected by lead terminals 38 to a plate 40 which serves as a second contact to the mounting surface. A hole is provided in plate 40 so that each respective device formed of strip 30 can be indexed by the die bonding and wire bonding equipment, such as by inserting and turning the spokes of a sprocket to advance the strip. A temporary support 44 (shown in FIG. 4B) connects pad area 34 to plate 40 during the molding of the device but is subsequently removed after molding.

FIG. 4A shows in greater detail three of the frames and supports shown in FIG. 3A. In accordance with the invention, the bonding pad 36 is raised above the surface of plate 40 and pad area 34. The bonding pad area 36 is connected to lead terminal 38 by a bent portion 37. Also shown in FIG. 4B is temporary support strip 44 which is also raised above pad area 34 and plate 40 by a pair of bent portions 44A and 44B which, as noted above, are removed after molding.

The process for fabricating the device package according to the invention includes the following steps:

A semiconductor device (not shown) attached to pad area 34 using methods known in the art, such as using an electrically conductive die attach compound. The bonding pad areas located on an opposing surface of the device are wire bonded to pad areas 36 using known wire bonding methods, such as ultrasonic wire bonding. Alternatively, the bonding pad areas opposing the surface of the die are solder connected to pad area 36 to further reduce the built-in resistance. The main pad area 34, bonding pad areas 36, and the semiconductor device are then encapsulated within a molded housing, typically formed of resin of other transfer mold compounds. This is also preformed using methods known in the art. The temporary support portion 44 and the top portion of plate 42 are then removed.

The interconnecting portions located between the respective device frames are then cut away to attain respective device packages such as is shown in FIG. 5A. Here, the device package 20 is shown after molding and a vestigial portion of plate 42 protrudes outside housing 20 as well as a portion of temporary connecting lead 44. Leads 38 also protrude from the device and connect to plate 40, which is not shown.

FIG. 5B illustrates an end view of the completed package showing the lead 38 flush with the bottom surface of the package. FIG. 5C shows a side view of device 20 which similarly shows the leads 38 flush with the bottom surface of the package.

FIG. 5D shows a bottom view of package 20 which depicts the exposed surface of plate 42 and its connected pad area 46. At one end of the package, leads 38 protrude at one end. At the opposite end leads 38 bend and are concealed within the package housing.

FIG. 5E illustrates a bottom view of the device according to an alternative embodiment in which a pad area 46 is also raised above the surface of plate 42 and is encapsulated within the body housing.

The device shown in FIGS. 5A–5E may then be soldered to the printed circuit board, or to any other known electrically and thermally conductive material, using conventional mass production soldering techniques.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method for manufacturing a semiconductor die package, said semiconductor die package housing a semiconductor device, said method comprising the steps of:

disposing at least one pin proximate to a main bonding pad area, said main bonding pad area having an extending portion extending from an edge of said main bonding pad area;

bending said at least one pin so that each pin has a pin bonding pad area, a bend, and a lead portion, and so that said pin bonding pad area is disposed above said main bonding pad area and said lead portion extends substantially at a common height with said main bonding pad area;

attaching said semiconductor device to said main bonding pad area; and encapsulating said semiconductor device and said at least one pin within a housing so that each of said lead portions, said extending portion of said main bonding pad area, and said main bonding pad area, extend beyond a periphery of said housing.

2. The method as claimed in claim 1, wherein said pin has a thickness which is the same as a thickness of said main bonding pad area.

3. The method as claimed in claim 1, further comprising, before said step of encapsulating, the step of making wire bond connections from said semiconductor device to said pin bonding pad areas.

4. A method for manufacturing a semiconductor device package, said method comprising the steps of:

forming a flat conductive lead frame to have a main pad area and an integral contact pin extending therefrom, said main pad area having a bottom, said lead frame further having a plurality of isolated pins which are isolated from said integral pin and said main pad area and are generally coextensive and coplanar with said integral contact pin;

thereafter bending said isolated pins at a point intermediate their length so that they have free ends which each lie in a common flat plane which is coplanar with said bottom of said main pad area;

thereafter attaching at least one semiconductor die to an upper surface of said main pad area;

thereafter making wire bond connections from said die to respective portions of said plurality of isolated pins; and thereafter molding said main pad area, said die, a portion of said integral contact pin, and said isolated pins with a plastic resin housing, such that said free ends of said isolated pins, a portion of said integral contact pin, and said bottom of said main pad area are accessible for electrical connections.

5. The method as claimed in claim 4, wherein said plurality of isolated pins each has a thickness which is the same as a thickness of said main pad area.

6. The method as claimed in claim 4, wherein said step of bending further includes bending said isolated pins to produce a bonding pad area for each pin, said bonding pad area being disposed above said main pad area and being effective to receive said wire bond connections.

7. The method as claimed in claim 4, wherein said step of forming further comprises forming said plurality of isolated pins so that said isolated pins extend at substantially the same height as said main pad area.

* * * * *